US012620426B2

(12) United States Patent
Wu et al.

(10) Patent No.: US 12,620,426 B2
(45) Date of Patent: May 5, 2026

(54) DETERMINISTIC VOLTAGE-CONTROLLED MAGNETIC ANISOTROPY (VCMA) MRAM WITH SPIN-TRANSFER TORQUE (STT) MRAM ASSISTANCE

(71) Applicant: International Business Machines Corporation, Armonk, NY (US)

(72) Inventors: Heng Wu, Santa Clara, CA (US); Julien Frougier, Albany, NY (US); Ruilong Xie, Niskayuna, NY (US); Kangguo Cheng, Schenectady, NY (US); Dimitri Houssameddine, Sunnyvale, CA (US)

(73) Assignee: International Business Machines Corporation, Armonk, NY (US)

( * ) Notice: Subject to any disclaimer, the term of this patent is extended or adjusted under 35 U.S.C. 154(b) by 540 days.

(21) Appl. No.: 17/655,569

(22) Filed: Mar. 21, 2022

(65) Prior Publication Data

US 2023/0298646 A1 Sep. 21, 2023

(51) Int. Cl.
$\quad$ *G11C 11/00* $\quad$ (2006.01)
$\quad$ *G11C 11/16* $\quad$ (2006.01)
$\quad\quad$ (Continued)

(52) U.S. Cl.
$\quad$ CPC ........ *G11C 11/161* (2013.01); *G11C 11/1675* (2013.01); *H10B 61/00* (2023.02); *H10N 50/80* (2023.02)

(58) Field of Classification Search
$\quad$ CPC ... G11C 11/161; G11C 11/1675; H10B 61/00; H10N 50/80
$\quad\quad$ (Continued)

(56) References Cited

U.S. PATENT DOCUMENTS 9,552,858 B2 $\quad$ 1/2017 $\quad$ Liu
9,620,562 B2 * $\quad$ 4/2017 $\quad$ Katine .................. H10B 61/00
$\quad\quad$ (Continued)

FOREIGN PATENT DOCUMENTS

WO $\quad$ 2012159078 A2 $\quad$ 11/2012
WO $\quad$ 2021056483 A1 $\quad$ 4/2021

OTHER PUBLICATIONS

Abdelrahman G.Qoutb, "Double magnetic tunnel junction-based nonvolatile logic", 2022, IEEE article, pp. 311-315. (Year: 2022).*
$\quad\quad$ (Continued)

*Primary Examiner* — Viet Q Nguyen
(74) *Attorney, Agent, or Firm* — Edward J. Wixted, III

(57) ABSTRACT

An approach for providing a semiconductor structure for a stacked magnetoresistive random-access memory (MRAM) device that includes a first magnetic tunnel junction on a bottom electrode and at least one second magnetic tunnel junction above the first magnetic tunnel junction. The semiconductor structure includes the first magnetic tunnel junction is a voltage-controlled magnetic anisotropy (VCMA) magnetic tunnel junction of a voltage-controlled magnetic anisotropy (VCMA) MRAM device. The VCMA-MRAM device is composed of a first reference layer, a first tunnel barrier layer, and a first free layer. The semiconductor structure includes the second magnetic tunnel junction that is a spin-transfer torque (STT) magnetic tunnel junction of a STT-MRAM device. The STT-MRAM device is composed of a second reference layer, a second tunnel barrier layer, and a second free layer where the STT magnetic tunnel junction has a smaller cross-sectional area than the VCMA magnetic tunnel junction (MTJ).

18 Claims, 7 Drawing Sheets

(51) Int. Cl.
    *H10B 61/00*     (2023.01)
    *H10N 50/80*     (2023.01)

(58) Field of Classification Search
    USPC ........................................................ 365/158
    See application file for complete search history.

(56) References Cited

U.S. PATENT DOCUMENTS

| | | | | |
|---|---|---|---|---|
| 9,646,670 | B2 | 5/2017 | Lee | |
| 9,721,636 | B1 | 8/2017 | Bedau | |
| 10,134,808 | B2 | 11/2018 | Kan | |
| 10,431,733 | B2 * | 10/2019 | Wang | H01F 10/3286 |
| 10,644,064 | B2 | 5/2020 | Lee | |
| 10,923,648 | B2 * | 2/2021 | Ahmed | G11C 11/1675 |
| 11,005,034 | B1 * | 5/2021 | Prasad | H01F 10/3286 |
| 11,227,645 | B2 * | 1/2022 | Sakhare | G11C 11/5607 |
| 11,316,104 | B2 * | 4/2022 | Hashemi | H10N 50/85 |
| 11,361,805 | B2 * | 6/2022 | Mihajlovic | H01F 10/3272 |
| 11,404,193 | B2 * | 8/2022 | Prasad | G11C 11/1675 |
| 11,404,633 | B2 * | 8/2022 | Gallagher | H10B 61/00 |
| 11,538,856 | B2 * | 12/2022 | Dixit | H01F 10/3259 |
| 11,682,514 | B2 * | 6/2023 | Dixit | H10B 61/22 |
| | | | | 257/421 |
| 11,729,996 | B2 * | 8/2023 | Wu | H10N 50/01 |
| | | | | 365/158 |
| 11,839,162 | B2 * | 12/2023 | Kalitsov | H10N 50/80 |
| 11,887,640 | B2 * | 1/2024 | Stewart | G11C 11/161 |
| 12,225,828 | B2 * | 2/2025 | Kalitsov | H10B 61/00 |
| 2009/0218645 | A1 | 9/2009 | Ranjan | |
| 2017/0077387 | A1 | 3/2017 | Kan | |
| 2018/0122825 | A1 * | 5/2018 | Lupino | H10N 70/231 |
| 2020/0098822 | A1 | 3/2020 | Toh | |
| 2020/0234748 | A1 * | 7/2020 | Kalitsov | H01F 10/3236 |
| 2021/0080048 | A1 * | 3/2021 | Martin | F16M 11/16 |
| 2021/0111337 | A1 * | 4/2021 | Huo | G11C 11/161 |
| 2021/0183557 | A1 * | 6/2021 | Carpenter | H01F 10/3254 |
| 2023/0064289 | A1 * | 3/2023 | Wu | H10N 50/01 |
| 2023/0240152 | A1 * | 7/2023 | Bauer | G11C 11/161 |

OTHER PUBLICATIONS

Wang Kang et al, Voltage-controlled MRAM for working memory: Perspective and Challenges, 2017, IEEE/DATE article, pp. 542-547 (Year: 2017).*

* cited by examiner

100

200

300

600

700

1000a

1000b

1200

1300

DETERMINISTIC VOLTAGE-CONTROLLED MAGNETIC ANISOTROPY (VCMA) MRAM WITH SPIN-TRANSFER TORQUE (STT) MRAM ASSISTANCE

BACKGROUND OF THE INVENTION

The present invention relates generally to the field of semiconductor memory device technology and more particularly to stacked magnetoresistive random-access memory devices using spin-transfer torque and voltage-controlled magnetic anisotropy.

A magnetic tunnel junction (MTJ) device, which is a primary storage element in a magnetic random-access memory (MRAM), is a magnetic storage and switching device in which two ferromagnetic layers are separated by a thin insulating barrier (e.g., magnesium oxide) to form a stacked structure. One of the ferromagnetic layers has a magnetization that is fixed, and it is therefore referred to as a pinned layer or reference layer. However, the other ferromagnetic layer has a magnetization that can change, and it is therefore referred to as a free layer. When a bias is applied to the MTJ device, electrons that are spin-polarized by the ferromagnetic layers traverse the insulating barrier through a process known as quantum tunneling to generate an electric current whose magnitude depends on an orientation of the magnetization of the ferromagnetic layers. The MTJ device will exhibit a low resistance when a magnetic moment of the free layer is parallel to the fixed layer magnetic moment, and it will exhibit a high resistance when the magnetic moment of the free layer is oriented antiparallel to the fixed layer magnetic moment.

In via spin-transfer-torque (STT)-MRAM devices, a Magnetic-Tunnel-Junction (MTJ) is formed by having magnetic (e.g., ferromagnetic) layers separated by an intermediary non-magnetic tunnel barrier layer. During operation, the magnetization orientation in the free layer of the MTJ is flipped using a spin-polarized electronic current via Spin-Transfer-Torque (STT) mechanism. The spin-polarization of the electronic current is generated by flowing the electrons though the magnetic reference layer exhibiting a fixed magnetization orientation. This spin-polarized electronic current subsequently flows through a magnetic free layer which changes the free layer orientation of its magnetization through the transfer of the spin angular momentum via the spin-transfer-torque mechanism.

A new approach to magnetic switching is evolving using voltage-controlled magnetic anisotropy. Voltage-controlled magnetic anisotropy (VCMA), which is generally observed at the interface between ultrathin 3d transition ferromagnetic metals (e.g., Fe, CoFeB) and nonmagnetic insulators (e.g., MgO, $Al_2O_3$), has emerged for use in MRAM devices. The discovery of the VCMA effect enables using a voltage or an electric field for switching an MTJ device. The utilization of a voltage instead of a charge current for writing data into an MTJ allows for much lower energy dissipation, as Ohmic loss or Joule heating can be greatly reduced. Furthermore, the VCMA effect enables fast, precessional switching of an MTJ by lowering the energy barrier between the two magnetization states of the MTJ. Based on this effect, a new generation of MRAM has emerged as VCMA-MRAM, which utilizes the VCMA effect to write or to assist STT to write data information into a magnetic tunnel junction (MTJ).

SUMMARY

Embodiments of the present invention provide a semiconductor structure for stacked magnetoresistive random-access memory (MRAM) device that includes a first magnetic tunnel junction on a bottom electrode and at least one second magnetic tunnel junction that is above the first magnetic tunnel junction. Embodiments of the present invention disclose that the first magnetic tunnel junction is a voltage-controlled magnetic anisotropy (VCMA) magnetic tunnel junction of a voltage-controlled magnetic anisotropy (VCMA) MRAM device. The VCMA-MRAM device is composed of a first reference layer, a first tunnel barrier layer, and a first free layer. Embodiments of the present invention include a semiconductor structure where the at least one second magnetic tunnel junction is a spin-transfer torque (STT) magnetic tunnel junction of a STT-MRAM device. The STT-MRAM device is composed of a second reference layer, a second tunnel barrier layer, and a second free layer where the STT magnetic tunnel junction has a smaller cross-sectional area than the VCMA magnetic tunnel junction (MTJ).

Embodiments of the present invention provide a method of performing a write operation on a stacked magnetoresistive random-access memory (MRAM) device composed of a bottom voltage-controlled magnetic anisotropy (VCMA) MRAM device and STT MRAM device where the STT MRAM device has a smaller cross-sectional area than the VCMA-MRAM device. Embodiments of the present invention include the method where the voltage applied on the VCMA-MRAM modulates the magnetic anisotropy of the VCMA-MTJ free layer effectively leading to a reduction of the energy barrier of the VCMA-MRAM device. In embodiments of the present invention, the STT-MRAM device switches due a smaller critical switching voltage (Vc) of the STT-MRAM device compared to the VCMA-MRAM device. The stray field generated by the free layer of the STT-MRAM device in the switched magnetic orientation deterministically aligns the magnetization of the VCMA-MRAM free layer in the same direction as the STT free layer. Embodiments of the present invention provide the method where when the applied voltage is removed, the energy barrier is recovered in the VCMA MRAM device, and the magnetization vectors remain oriented in the desired switched state.

BRIEF DESCRIPTION OF THE DRAWINGS

The above and other aspects, features, and advantages of various embodiments of the present invention will be more apparent from the following description taken in conjunction with the accompanying drawings.

DETAILED DESCRIPTION

Figure 1:
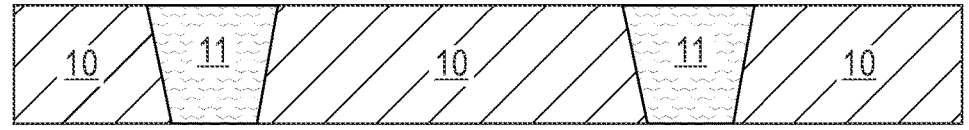
FIG. 1 is a cross-sectional view of a semiconductor structure after forming a bottom contact in an interlayer dielectric (ILD) material in accordance with an embodiment of the present invention.

Embodiments of the present invention recognize that magnetic random-access memory (MRAM) has been widely studied as the leading, future nonvolatile working memory candidate. Embodiments of the present invention recognize that the current spin-transfer torque (STT) driven MRAMs also known as STT-MRAMs face intrinsic limitations in terms of high write power and long latency that can potentially limit the applications for low power and high-speed working memories.

Embodiments of the present invention recognize that the recently developed new-generation of MRAMs known as voltage-controlled magnetic anisotropy (VCMA) MRAM using the voltage-controlled magnetic anisotropy (VCMA) effect to write or assist in writing data into magnetic tunnel junctions (MTJs). Embodiments of the present invention recognize that VCMA-MRAM holds the promise to efficiently overcome some of the limitations (e.g., high write power and long latency) associated with STT-MRAM. Embodiments of the present invention recognize that while VCMA-MRAM can provide low power consumption, due to the symmetrical switching associated with the VCMA effect, the switch of a VCMA-MTJ can be non-deterministic. In operation with the VCMA effect, when the energy barrier is lowered for switching in a VCMA-MRAM, a well-controlled pulse timing is needed to achieve the preferred state which may be subject to a high variation.

Embodiments of the present invention recognize that VCMA switching mechanism can require precessional reversal of the magnetization vector carried by a ferromagnetic free layer of an MTJ. A voltage applied across the tunnel barrier in a VCMA-MRAM can effectively reduce the Perpendicular Magnetic Anisotropy (PMA) in the free layer forcing the magnetization to become in-plane due to the shape anisotropy. Further, an external in-plane magnetic field is applied making the free layer precess around the horizontal axis between parallel and antiparallel magnetic state. The timing of the write pulse determines if the free layer ends in a parallel or antiparallel state. Embodiments of the present invention recognize that this precessional switching is unreliable for large memory arrays due to device-to-device variation.

Embodiments of the present invention provide a semiconductor structure and a method of forming an MTJ-based memory device with stacked MRAMs composed of a VCMA-MRAM stacked with an STT-MRAM. Embodiments of the present invention provide an STT-MRAM with a smaller cross-sectional area stacked over a larger VCMA-MRAM with a larger cross-sectional area where the stray field generated by the free layer of the STT-MRAM assist deterministically the switching of the VCMA-MRAM free layer. Embodiments of the present invention disclose forming a STT-MRAM MTJ that is smaller than the VCMA-MRAM MTJ in the stacked MRAM. When the STT-MRAM MTJ exhibits a smaller cross-sectional area than the VCMA-MRAM MTJ, the tunnel barrier area and associated Resistance-Area product (RA) of the STT-MRAM MTJ are lower than the VCMA-MRAM MTJ RA product thus making the STT-MRAM easier to switch. Moreover, the smaller size of the STT-MRAM provides the STT-MRAM with a higher current density than the larger VCMA-MRAM making the STT-MRAM easier to switch using a spin-transfer torque current. With the high RA product of the larger VCMA-MRAM MTJ, a dominant portion of the applied voltage drops across the VCMA tunnel barrier allowing a reduction of the energy barrier by modulating the Perpendicular Magnetic Anisotropy (PMA) of the VCMA-MTJ free layer. Embodiments of the present invention provide a stacked MRAM device using an STT-MRAM assisted switch of the VCMA-MRAM occurring due to the stray field generated by the free layer of the STT-MRAM. Using this method, the deterministic switch of the VCMA-MRAM free layer can occur without an applied external field.

Embodiments of the present invention also provide a stacked MRAM structure with a smaller STT-MRAM under a larger VCMA-MRAM and a stacked MRAM structure where both the STT-MRAM and the VCMA-MRAM have the same diameter. Furthermore, embodiments of the present invention include a stacked MRAM structure with a spin valve created with a reference layer, a metallic spacer, and a free layer that is over a VCMA-MTJ. Embodiments of the present invention include forming two or more VCMA-MTJs under one or more STT-MTJs. Similarly, embodiments of the present invention include forming two or more STT-MTJs over or under one or more VCMA-MTJs.

Embodiments of the present invention provide device write operations that include both a single step switch and two step switch for device write operation. The single step switch write operation for a stacked MRAM device using a smaller STT-MRAM and a larger VCMA-MRAM includes applying a single, high voltage pulse. In various embodiments of the present invention, the voltage bias on the VCMA-MRAM is the first phase of the switching mechanism where the magnetic anisotropy of the VCMA-MTJ free layer is modulated effectively leading to a reduction of the energy barrier separating the two stable magnetic states. In this method, due to the resistance difference in the MRAM devices, most of the voltage drop occurs on the VCMA-MRAM.

In a second phase of the switching driven by the single high voltage pulse, the upper STT-MRAM switches using the STT switch mechanism due to its smaller RA product, for example, due to the smaller cross-sectional area of the STT MRAM and smaller critical switching voltage (Vc). Then, in a third phase of the switching, the stray field generated by the free layer of the STT-MRAM in the new desired magnetic orientation can deterministically align the magnetization of the VCMA-MRAM free layer in the same direction as the STT free layer. In a fourth phase of the switching, when the applied voltage is removed, the energy barrier separating the two stable magnetic states of the VCMA-MRAM free layer is recovered and the magnetization vector remains oriented in the desired state.

Embodiments of the present invention provide a two-step switch device write operation for the stacked MRAM device. In this method, the first step includes applying a small current to the top STT-MRAM MTJ to switch the top STT-MRAM MTJ to a preferred state. In the second step, a voltage is applied across the top and bottom electrodes. Under the applied electric field, the energy barrier of the VCMA-MRAM MTJ will be lowered. The stray field generated by the free layer of the STT-MRAM in the new desired magnetic orientation will then deterministically align the magnetization of the VCMA-MRAM free layer along the same direction. When the applied voltage is removed, the energy barrier separating the two stable magnetic states of the VCMA-MRAM free layer is recovered and the magnetization vector remains oriented in the desired states.

Embodiments of the present invention also provide a method forming the stacked MRAM where the STT-MRAM and the VCMA-MRAM are patterned separately without using an extra mask. Additionally, embodiments of the present invention provide method of forming the stacked MRAM using self-aligning spacer processes to make the top and bottom MTJs of the stacked MRAM with different sizes.

Detailed embodiments of the claimed structures and methods are disclosed herein. The method steps described below do not form a complete process flow for manufacturing integrated circuits, such as semiconductor devices. The present embodiments can be practiced in conjunction with the integrated circuit fabrication techniques currently used in the art, for magnetic tape heads, and only so much of the commonly practiced process steps are included as are necessary for an understanding of the described embodiments. The figures represent cross-section portions of an MRAM device after fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of wellknown features and techniques may be omitted to avoid unnecessarily obscuring the presented embodiments.

References in the specification to "one embodiment", "other embodiment", "another embodiment", "an embodiment", etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the interest of not obscuring the presentation of the embodiments of the present invention, in the following detailed description, some of the processing steps, materials, or operations that are known in the art may have been combined together for presentation and for illustration purposes and in some instances may not have been described in detail. Additionally, for brevity and maintaining a focus on distinctive features of elements of the present invention, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

FIG. 1 is a cross-sectional view of semiconductor structure 100 after forming bottom electrode (BE) 11 in interlayer dielectric (ILD) 10 in accordance with an embodiment of the present invention. Semiconductor structure 100 can be a portion of a semiconductor structure formed on a semiconductor substrate such as a wafer or a portion of a wafer. In various embodiments, semiconductor structure 100 includes a bottom electrode (i.e., BE 11) for each of two magnetoresistive random access memory (MRAM) devices. In various embodiments, semiconductor structure 100 is formed above one or more logic devices or front-end of the line (FEOL) devices such as transistors (not depicted in FIG. 1). Semiconductor structure 100 may be formed in the middle of the line (MOL) or in the back end of the line (BEOL), for example. In various embodiments, semiconductor structure 100 provides BE 11 for an embedded memory device and/or a standard memory device. Any number of BE 11 can be formed in ILD 10. BE 11 can be any electrode metal material used in memory devices, such as but not limited to titanium nitride (TiN), tantalum nitride (TaN) or tantalum (Ta).

Figure 2:
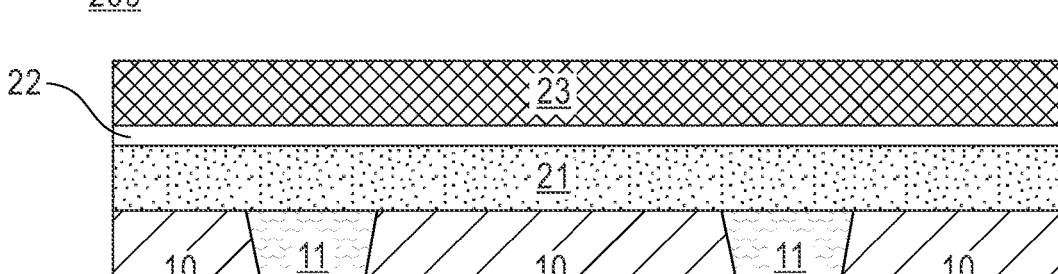
FIG. 2 is a cross-sectional view of the semiconductor structure after sequentially depositing a reference layer, a tunnel barrier layer, and a free layer of a voltage-controlled magnetic anisotropy magnetic tunnel junction (VCMA-MTJ) in accordance with an embodiment of the present invention.

FIG. 2 is a cross-sectional view of semiconductor structure 200 after sequentially depositing VCMA reference layer 21, VCMA tunnel barrier 22, and VCMA free layer 23 in accordance with an embodiment of the present invention. As depicted, FIG. 2 includes ILD 10, BE 11, VCMA reference layer 21, VCMA tunnel barrier 22, and VMCA free layer 23. VCMA reference layer 21, VCMA tunnel barrier 22, and VCMA free layer 23 are material layers that can form a voltage-controlled magnetic anisotropy magnetic tunnel junction (VCMA-MTJ).

As depicted, VCMA reference layer 21 is deposited on BE 11 and ILD 10 using one or more known deposition processes. VCMA reference layer 21 is a magnetic layer that may be composed of one or more materials as known to one skilled in the art.

VCMA tunnel barrier 22 can be deposited on VCMA reference layer 21 using known deposition processes. In various embodiments, VCMA tunnel barrier 22 is a non-magnetic tunnel barrier layer. For example, VCMA tunnel barrier 22 may be formed with a dielectric material capable of providing a high targeted Resistance-Area product (RA) such as but not limited to magnesium oxide (MgO) or any other non-magnetic material used in VCMA-MTJs. As known to one skilled in the art, RA can be a product of the resistance multiplied by the area and can be affected by both the area of the layer, the thickness of the layer and the type of material in the layer.

VCMA free layer 23, deposited using known semiconductor deposition processes on VCMA tunnel barrier 22, may be composed of any material suitable for a VCMA free layer. For example, VMCA free layer 23 is a thin, magnetic layer composed one or several layers of magnetic materials. In some cases, VMCA free layer 23 may be composed of several or many layers of magnetic materials and non-magnetic materials. For example, VCMA reference layer 21 may include a layer of materials such as iron (Fe), cobalt (Co) and Boron (B), Fe and platinum (Pt), chromium (Cr), gold (Au), or any known combination of materials forming a reference layer in a VCMA-MTJ. In an embodiment, a second set of layers for a second VCMA is deposited over BE 11 and ILD 10.

Figure 3:
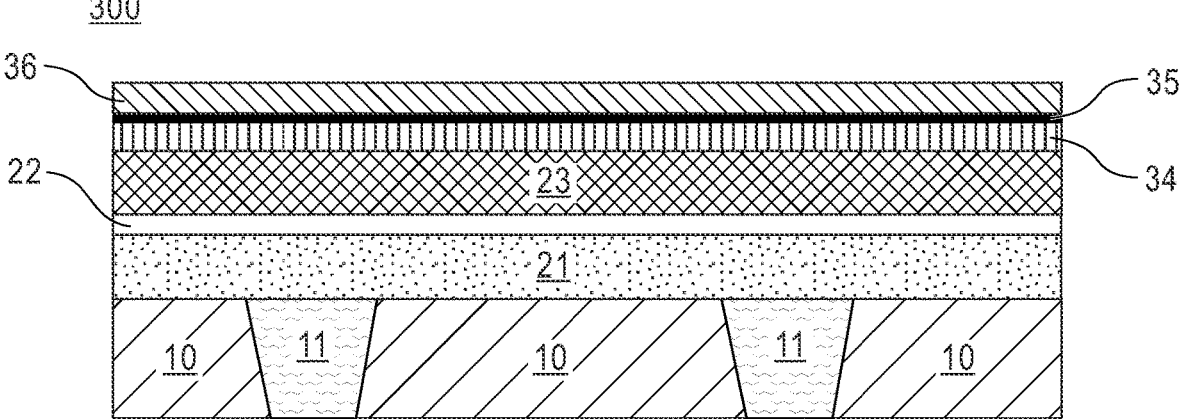
FIG. 3 is a cross-sectional view of the semiconductor structure after sequentially depositing a reference layer, a tunnel barrier layer, and a free layer of a spin-transfer torque magnetic tunnel junction (STT-MTJ) in accordance with an embodiment of the present invention.

FIG. 3 is a cross-sectional view of semiconductor structure 300 after sequentially depositing spin-transfer torque (STT) reference layer 34, STT tunnel barrier 35, and STT free layer 36 in accordance with an embodiment of the present invention. As depicted, FIG. 3 includes the elements of FIG. 2 and STT reference layer 34, STT tunnel barrier 35, and STT free layer 36.

STT reference layer 34 can be deposited with one or more known semiconductor deposition processes. For example, STT reference layer 34 can be a magnetic layer composed of one or multiple layers of magnetic materials. STT reference layer 34 may be composed of any material or combination of materials used in STT-MTJs. In some cases, as known to one skilled in the art, STT free layer 23 may be composed of several or many layers of magnetic materials and non-magnetic materials.

STT tunnel barrier 35 can be any non-magnetic, dielectric material typically used in VCMA-MTJs such as but not limited to MgO. For example, STT tunnel barrier 35 can be material capable providing a high tunnel barrier current, in the low resistance of the MTJ. STT tunnel barrier 35 is deposited on STT reference layer 34.

STT free layer 36 can be deposited on STT tunnel barrier 35 using one or more known semiconductor deposition processes. STT free layer 36 may be composed of any material or materials suitable for an STT free layer. For example, STT free layer 36 is a thin, magnetic layer. For example, STT free layer 36 may consist of CoFeB but is not limited to these materials. In some cases, STT free layer 36 may be composed of several layers of materials. In one embodiment, a second set of layers for a second STT-MTJ is deposited over STT free layer 36.

Figure 4:
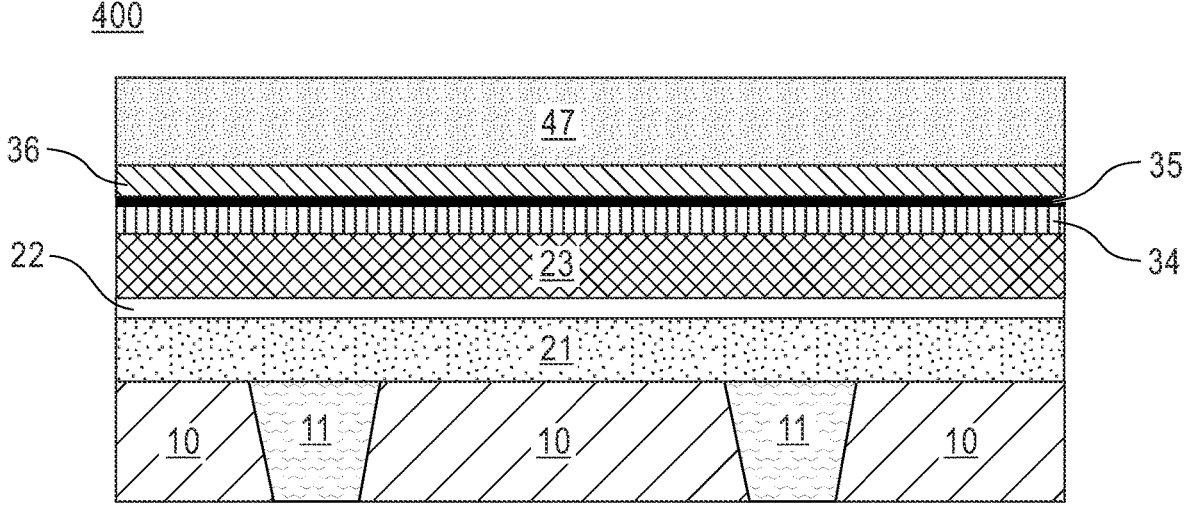
FIG. 4 is a cross-sectional view of the semiconductor structure after depositing a hardmask layer on the free layer of the STT-MTJ in accordance with an embodiment of the present invention.

FIG. 4 is a cross-sectional view of semiconductor structure 400 after depositing hardmask 47 on STT free layer 36 in accordance with an embodiment of the present invention. As depicted, FIG. 4 includes the elements of FIG. 3 and hardmask 47. Hardmask 47 may be composed of any hardmask material used in MRAM devices. For example, hardmask 47 may be composed of tantalum nitride (TaN) or titanium nitride (TiN) but is not limited to these materials.

Figure 5:
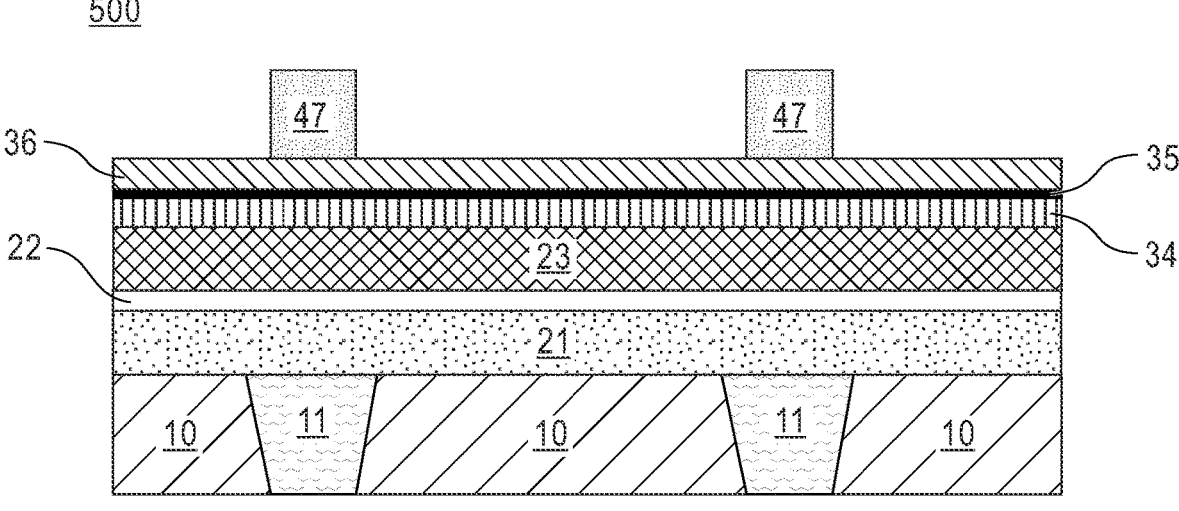
FIG. 5 is a cross-sectional view of the semiconductor structure after patterning the hardmask layer in accordance with an embodiment of the present invention.

FIG. 5 is a cross-sectional view of semiconductor structure 500 after patterning hardmask 47 in accordance with an embodiment of the present invention. Using lithography and known semiconductor etching process, the layer of hardmask 47 is patterned and portions of hardmask 47 are removed. As depicted, the remaining portions of hardmask 47 are each above one of BE 11.

In various embodiments, the width of the remaining hardmask 47 determines the width of the STT-MTJ formed in later processes (e.g., depicted in FIG. 6). In particular, the width of hardmask 47 determines the width of STT tunnel barrier 35 in later processes. The width of STT tunnel barrier 35 can determine the resistance-area product (RA) of the tunnel barrier. As previously described, for deterministic switching of the completed VCMA-MTJ in FIG. 10A, it is desirable to have a low RA of STT tunnel barrier 35 with less wide tunnel barrier that is created by a smaller width and/or cross-sectional area of hardmask 47 and a larger RA for the wider VCMA tunnel barrier 22.

In other embodiments, the width of the remaining hardmask 47 can change depending on the desired structure and properties of STT-MTJ and VCMA-MTJ formed in later process steps (e.g., a smaller STT-MTJ depicted in FIG. 10A or a larger STT-MTJ and VCMA-MTJ depicted in FIG. 12).

Figure 6:
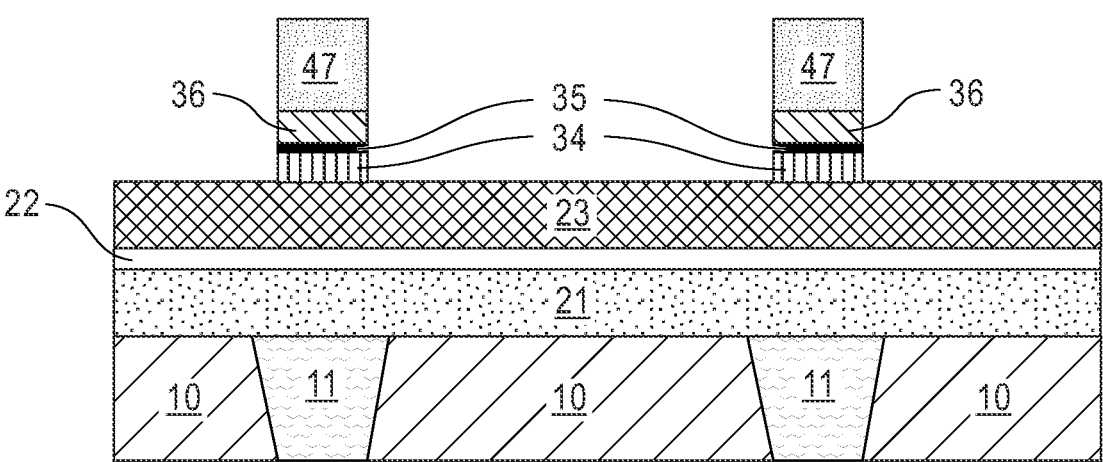
FIG. 6 is a cross-sectional view of the semiconductor structure after removing portions of the STT-MTJ free layer, tunneling barrier layer, and reference layer in accordance with an embodiment of the present invention.

FIG. 6 is a cross-sectional view of semiconductor structure 600 after removing portions of STT-MTJ free layer 36, STT tunnel barrier 35, and STT reference layer 34 in accordance with an embodiment of the present invention. Using the remaining portions of hardmask 47 as an etch mask, the exposed portions of STT-MTJ free layer 36, STT tunnel barrier 35, and STT reference layer 34 are removed above VCMA free layer 23. For example, a non-selective etching process, such as an ion beam etch (IBE), removes the exposed portions of STT-MTJ free layer 36, STT tunnel barrier 35, and STT reference layer 34 and stops on VCMA free layer 23. The removal of portions of STT-MTJ free layer 36, STT tunnel barrier 35, and STT reference layer 34 can form an STT-MTJ or an STT-MRAM pillar of a STT-MRAM device. As known to one skilled in the art, in some cases, the etch process can be time to stop in the VCMA-MTJ free layer 23 by leveraging in-situ elemental detection of the etch by-products in the etch chamber. The etch can also be end-pointed by selectivity using other etching techniques such as reactive ion etching (RIE).

Figure 10A:
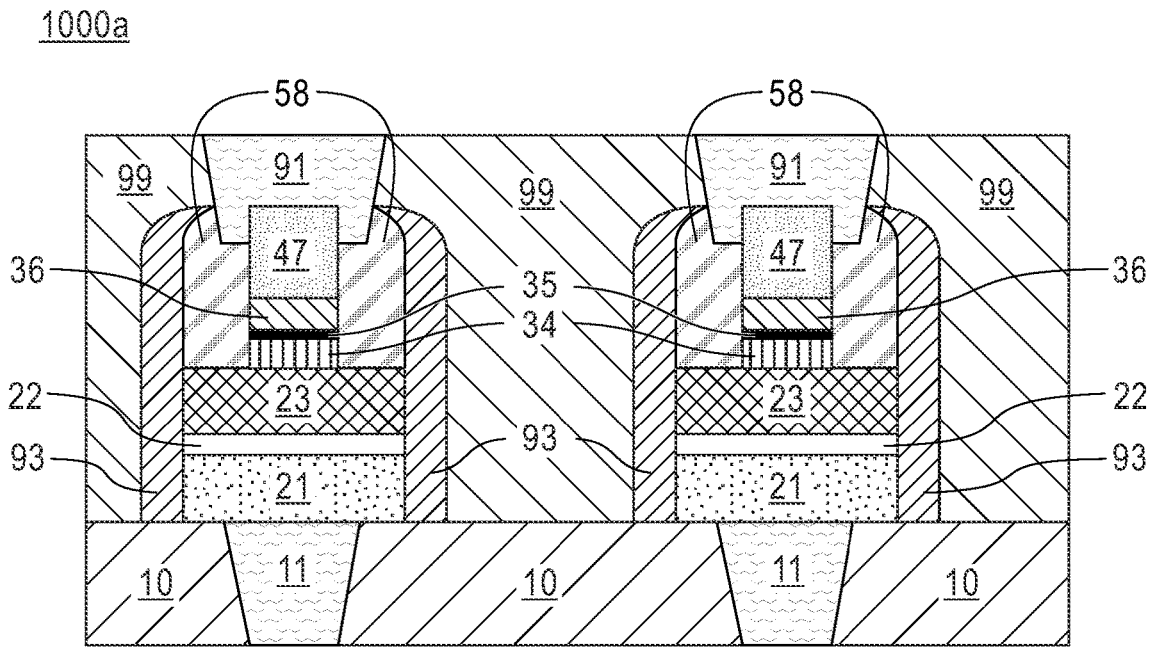
FIG. 10A is a cross-sectional view of the semiconductor structure after forming a top electrode over hardmask material in accordance with an embodiment of the present invention.
Figure 10B:
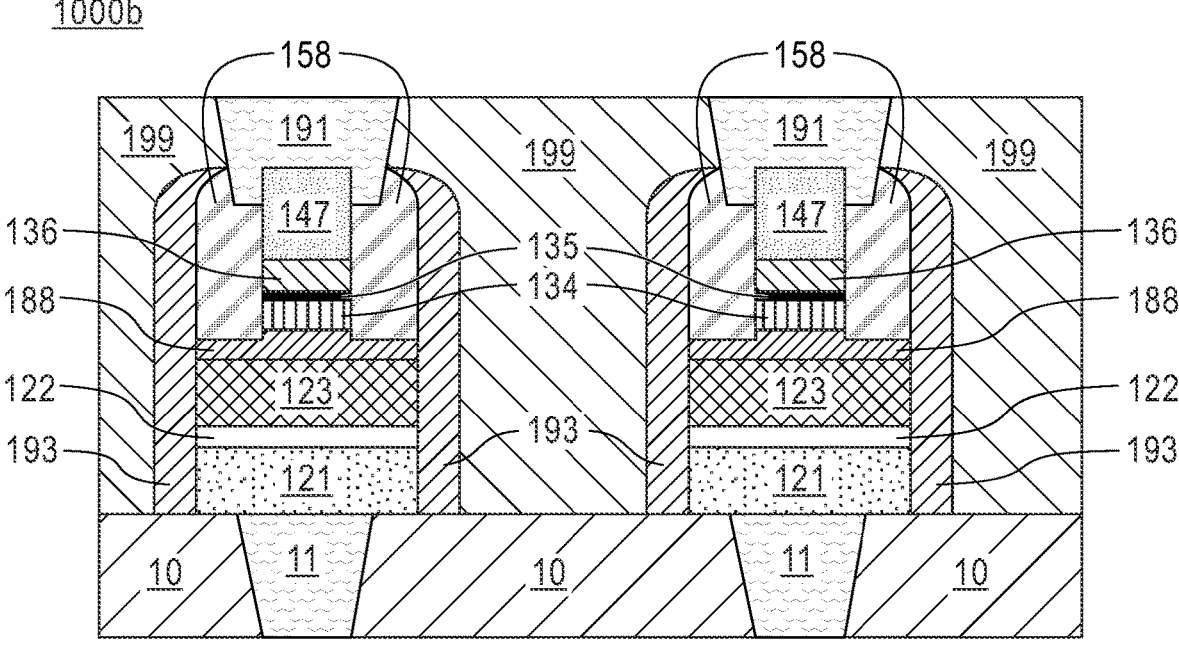
FIG. 10B is a cross-sectional view of a semiconductor structure with an etch stop layer deposited on the VCMA free layer in accordance with an embodiment of the present invention.
Figure 10C:
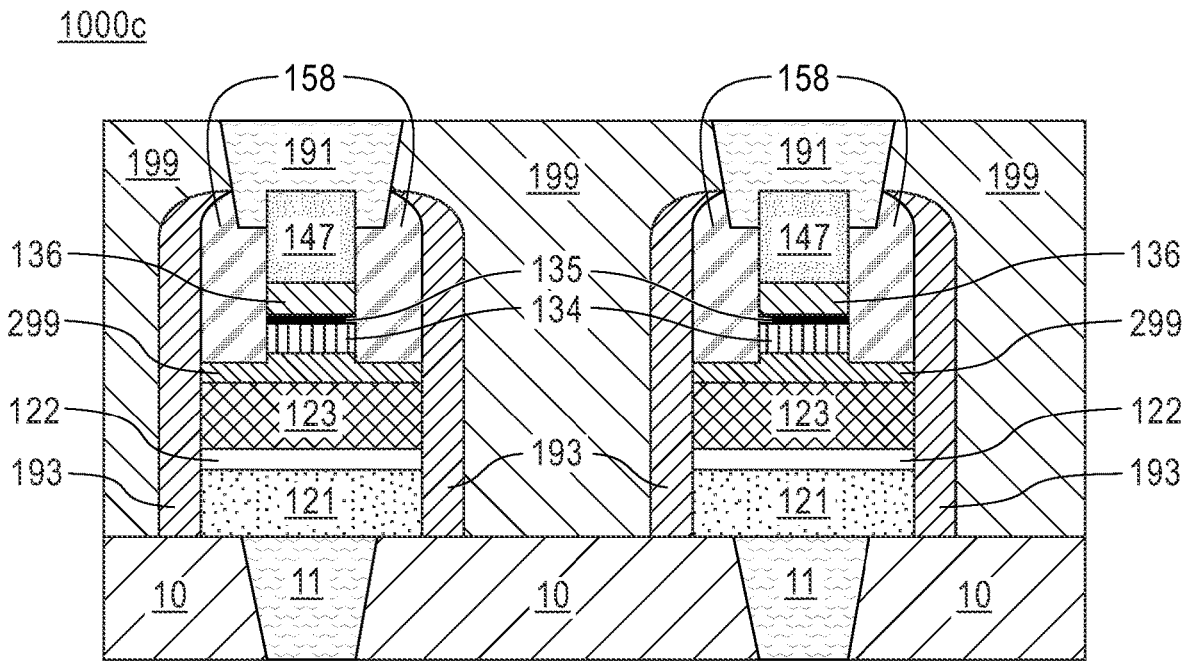
FIG. 10C is a cross-sectional view of a semiconductor structure with a soft magnetic layer deposited on the VCMA free layer in accordance with an embodiment of the present invention.

In various embodiments, the diameter of the remaining portions of hardmask 47, STT-MTJ free layer 36, STT tunnel barrier 35, and STT reference layer 34 can be varied to attain the current density and RA needed to switch the formed STT-MTJ and VCMA-MTJ depicted in FIGS. 10A, 10B, and 10C. In various embodiments, the width of the remaining portions of hardmask 47 should be such that the width of STT tunnel barrier 35 can be smaller than the width of VCMA tunnel barrier 22 depicted in FIG. 10A. As previously discussed, for the deterministic switching of the VCMA-MTJ depicted in semiconductor structure 1000a using the stray field of the STT-MTJ, it is desirable for STT tunnel barrier 35 to provide a low RA or a RA that is lower than the RA of VCMA tunnel barrier 22 in the completed stacked MRAM device of FIG. 10A.

Figure 7:
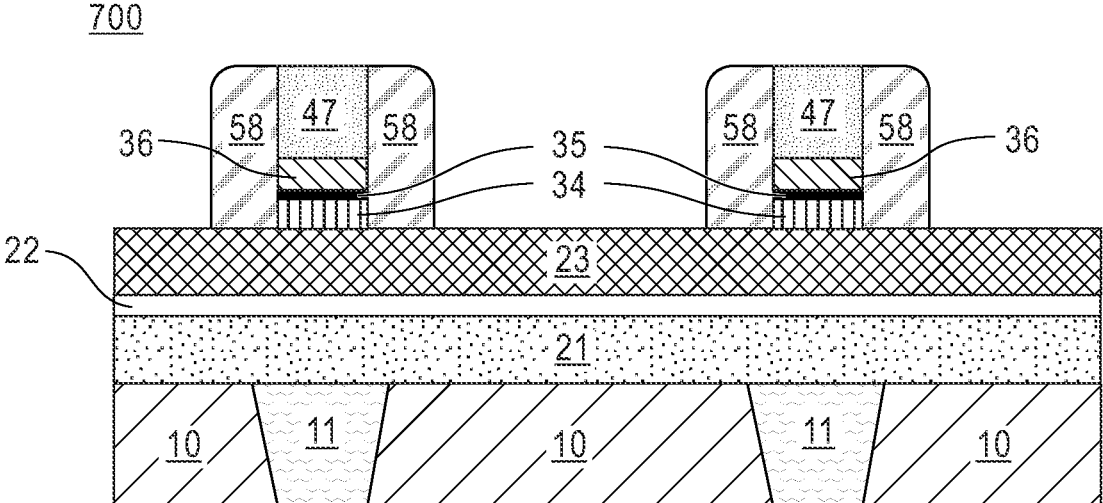
FIG. 7 is a cross-sectional view of the semiconductor structure after forming a sidewall spacer around the STT-MTJ in accordance with an embodiment of the present invention.

FIG. 7 is a cross-sectional view of semiconductor structure 700 after forming sidewall spacer 58 around the STT-MTJ in accordance with an embodiment of the present invention. As depicted, FIG. 7 includes the elements of FIG. 6 and sidewall spacer 58 surrounding hardmask 47, STT-MTJ free layer 36, STT tunnel barrier 35, and STT reference layer 34. Sidewall spacer 58 can be composed of any dielectric spacer material. Sidewall spacer 58 can be formed using known self-aligned spacer formation processes including a conformal deposition of a dielectric material such as but not limited to SiN that is followed a directional aniso-tropic etch (e.g., a reactive ion etch).

Figure 8:
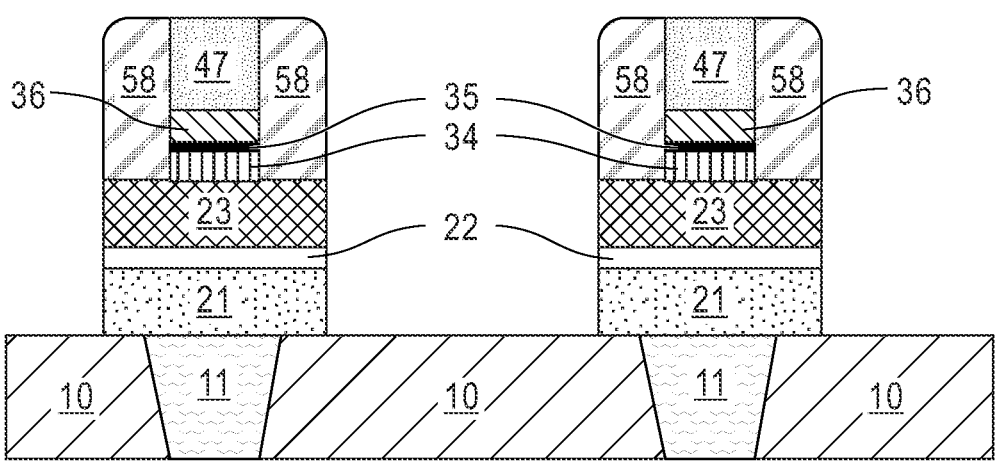
FIG. 8 is a cross-sectional view of the semiconductor structure after removing portions of the VCMA free layer, tunneling barrier layer, and reference layer in accordance with an embodiment of the present invention.

FIG. 8 is a cross-sectional view of semiconductor structure 800 after removing portions of VCMA free layer 23, VCMA tunnel barrier 22, and VCMA reference layer 21 in accordance with an embodiment of the present invention. Using a self-aligned process with sidewall spacer 58 as an etch mask, an etch process such as an ion beam etch (IBE) can remove the exposed portions of VCMA free layer 23, VCMA tunnel barrier 22, and VCMA reference layer 21 to form a pillar for a VCMA-MTJ. The diameter of the MRAM pillar for the VCMA-MTJ is larger than the diameter of the MRAM pillar for the STT-MTJ that is formed in FIG. 6. For example, when the STT-MTJ pillar diameter in is the range of 25 to 40 nm when the current density to switch the STT device is in the range of 2 to 15 MA/cm², a diameter of the VCMA-MTJ could be in the range of 40 to 60 nm.

Figure 9:
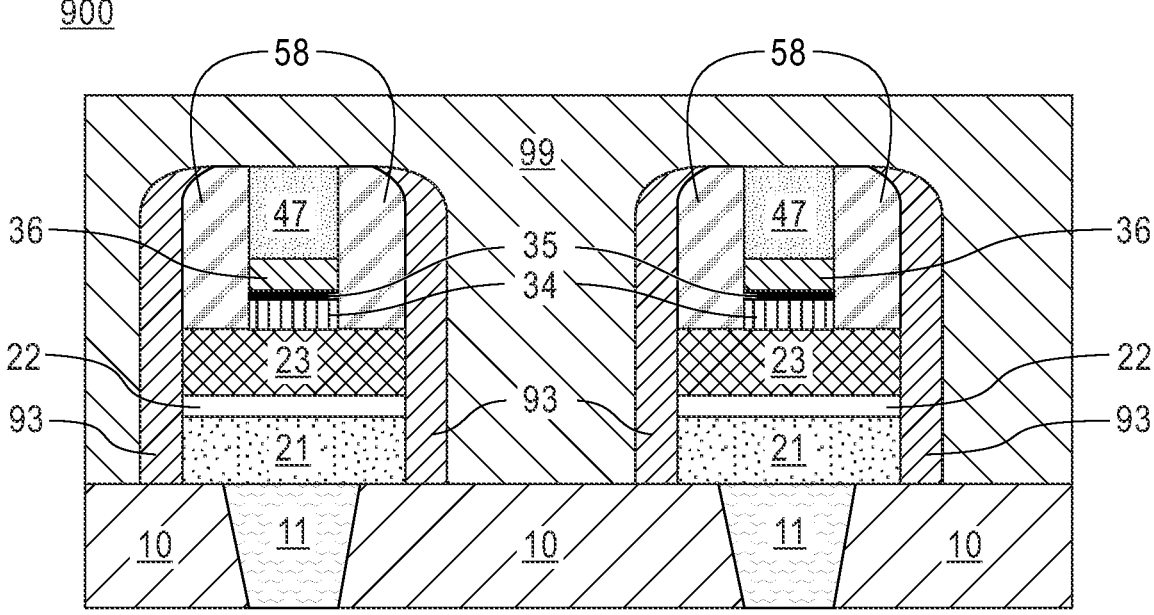
FIG. 9 is a cross-sectional view of the semiconductor structure depositing a dielectric material for a spacer, etching horizontal portions of the dielectric material, and depositing an ILD material in accordance with an embodiment of the present invention.

FIG. 9 is a cross-sectional view of semiconductor structure 900 depositing a dielectric material for spacer 93, performing a directional anisotropic etch of the dielectric material, and depositing an ILD 99 in accordance with an embodiment of the present invention. As depicted, FIG. 9 includes the elements of FIG. 8 with spacer 93 and ILD 99. Using previously discussed self-aligned sidewall spacer formation processes, a dielectric material for spacer 93 is deposited and horizontal portions of the dielectric material (e.g., SiN) are removed by RIE to spacer 93 surrounding sidewall spacer 58 and the VCMA-MTJ. Spacer 93 contacts the vertical sides of VCMA free layer 23, VCMA tunnel barrier 22, VCMA reference layer 21, and sidewall spacer 58. Spacer 93 resides on a portion of ILD 10. As depicted, ILD 99 can be deposited over exposed surfaces of ILD 10, spacer 93, spacer 58, and hardmask 47.

FIG. 10A is a cross-sectional view of semiconductor structure 1000a after forming top electrode (TE) 91 over hardmask 47 and a portion of sidewall spacer 58 in accor-dance with an embodiment of the present invention. As depicted, FIG. 10A includes the elements of FIG. 9 and TE 91. Using known electrode formation processes, such as ILD 99 etch, electrode material deposit, and a chemical-mechani-cal polish, TE 91 can be formed over and contacting hardmask 47. In some cases, a portion of sidewall spacer 58 may be removed during ILD etch, and in this case, a small portion of TE 91 contacts sidewall spacer 58. TE 91 con-nects through hardmask 91, STT-MTJ, and VCMA-MTJ to BE 10.

Semiconductor structure 1000a that can be over one or more logic devices. As previously discussed, semiconductor structure 1000a can provide a semiconductor structure with a stacked STT-MRAM and a VCMA-MRAM where after applying a single high voltage pulse, the magnetic anisot-ropy of the VCMA-MTJ free layer is modulated effectively leading to a reduction of the energy barrier separating the two stable magnetic states (e.g., of the STT free layer and the VCMA free layer) and the STT-MRAM switches due smaller critical switching voltage (Vc) and lower RA value than the VCMA-MRAM. In a next phase of the determin-istic switching of the VMCA MRAM, the stray field gen-erated from the switched STT-MRAM can switch the VCMA-MRAM device such that the VCMA free layer 23 and STT free layer 36 to have the same direction (e.g., parallel to the plane or anti-parallel). In this way, the magnetization direction of the VCMA free layer matches the magnetization of the STT free layer. When the applied voltage is removed, the energy barrier separating the two stable magnetic states of the VCMA-MRAM free layer recovers, and the magnetization vector remains oriented in the desired state.

FIG. 10B is a cross-sectional view of semiconductor structure 1000b with etch stop layer 188 deposited on VCMA free layer 36 in accordance with an embodiment of the present invention. As depicted, FIG. 10B includes the elements of FIG. 10A with etch stop layer 188 added between VCMA free layer 23 and STT reference layer 34. In various embodiments, etch stop layer 188 can be deposited on VCMA free layer 36, for example, as an additional layer in FIG. 2. STT free layer 34 can then be deposited on etch stop layer 188. Etch stop layer 188 can be a conductive material or another material such as but not limited to TiN or TaN. A typical thickness of etch stop layer 188 can range from 3 to 10 nm but is not limited to this range. Etch stop layer 188 ensures a process margin in the removal of the portions of the STT-MTJ materials. Etch stop layer 188 provides additional etch process margin or an etch process end point to prevent inadvertent removal of a top portion of VCMA free layer 34 during the etch of the layers of the STT-MTJ (depicted in FIG. 6).

FIG. 10C is a cross-sectional view of semiconductor structure 1000c with soft magnetic layer 299 deposited on VCMA free layer 34 in accordance with an embodiment of the present invention. As depicted, FIG. 10C includes the elements of FIG. 10B except with soft magnetic layer 299 between VCMA free layer 23 and STT reference layer 34. Soft magnetic layer 299 provides both the capacity to act as an etch stop and may act as a magnetic field guide. A magnetic field guide can be composed of a soft magnetic material, preferably with a high relative permeability. Soft magnetic layer 299 can be composed of a soft magnetic material that can be easily magnetized and demagnetized (e.g., with an intrinsic coercivity less than 1000 Am−1) and can be used to enhance and/or channel the flux produced by an electric current. For example, soft magnetic layer 299 may be but is not limited to soft magnetic materials com-posed of nickel and iron, cobalt and iron, a combination of these materials, or any other suitable soft magnetic material.

Figure 11:
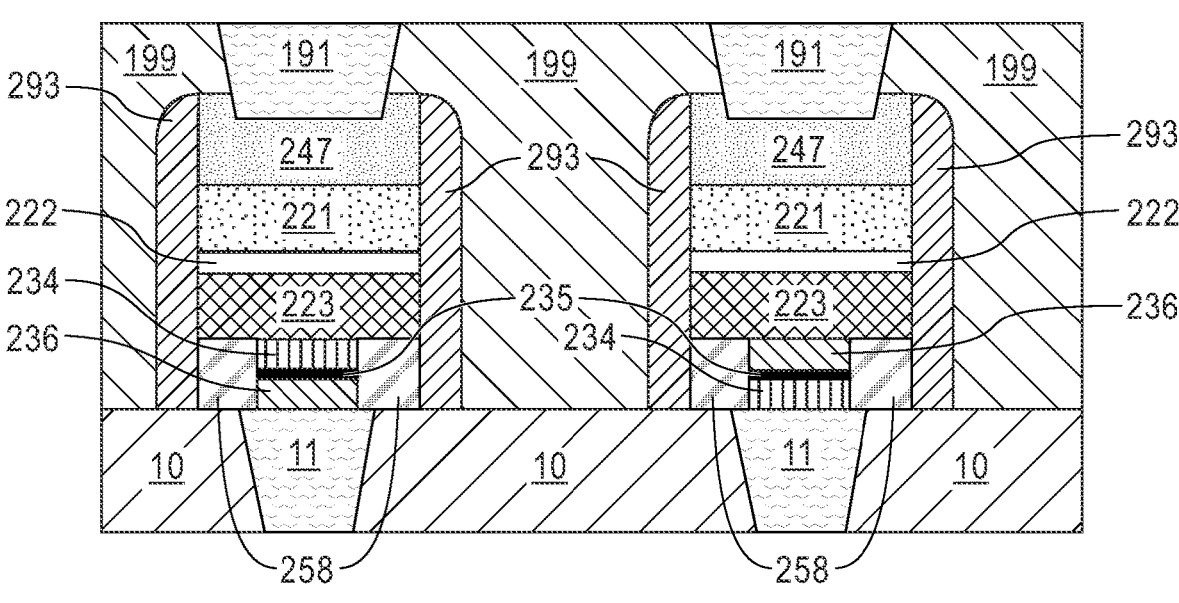
FIG. 11 is a cross-sectional view of a semiconductor structure after forming the STT-MTJ on a bottom electrode, forming the VCMA-MTJ over the STT-MTJ, and forming the sidewall spacer of the STT-MTJ in accordance with an embodiment of the present invention.

FIG. 11 is a cross-sectional view of semiconductor struc-ture 1100 after forming the STT-MTJ on BE 11 with the VCMA-MTJ over the STT-MTJ in accordance with an embodiment of the present invention. FIG. 11 depicts an example of a portion of a semiconductor chip where semiconductor structure 1100 is over one or more logic devices (not depicted). Semiconductor structure 1100 illustrates two stacked MRAM devices. In FIG. 11, the bottom MRAM with a smaller STT-MTJ (e.g., a smaller STT-MRAM MTJ) is under a larger VCMA-MTJ. As depicted, FIG. 11 includes ILD 10, BE 11, encapsulant 258 on a portion of BE 11 and ILD 10, STT free layer 236 on BE 11, STT tunnel barrier 235, STT reference layer 234 under a portion of VCMA free layer 223, VCMA tunnel barrier 222, VCMA reference layer 221 under hardmask 247, TE 191, spacer 293, and ILD 199.

The STT-MTJ can be formed using the deposition processes of FIG. 4 where STT free layer 236, STT tunnel barrier 235, STT reference layer 234 can be formed with the same or similar processes and materials as STT free layer 36, STT tunnel barrier 22, STT reference layer 21 deposited in FIG. 2. However, in FIG. 11, STT free layer 236 is deposited over BE 11 and ILD 10, STT tunnel barrier 235 is over STT free layer 236 and under STT reference layer 221. Then, the layers of the VCMA-MTJ are deposited as depicted in FIG. 11 in reverse order of FIG. 3 over STT reference layer 234. Hardmask 247 is deposited over VCMA reference layer 221.

In some cases, hardmask 247 can be patterned and used as an etch mask to remove exposed portions of VCMA reference layer 221, VCMA tunnel barrier 222, VCMA free layer 223, STT reference layer 234, STT tunnel barrier 235, and STT free layer 236. In some embodiments, a lateral etch of STT reference layer 234, STT tunnel barrier 235, and STT free layer 236 occurs. Using known lateral etching processes, portions of the STT-MTJ can be removed. For example, 2 to 15 nm of each layer of the STT-MTJ may be removed and a dielectric material for encapsulant 258 may be conformally deposited in the notch created by the lateral etch process. The dielectric material can encapsulate the STT-MTJ by forming encapsulant 258. In some cases, an etch process such as RIE any excess dielectric material for encapsulate 258 not under hardmask 247 may be removed.

Spacer 293 may be formed using previously discussed sidewall spacer formation processes and ILD 199 deposited on ILD 10, around spacer 193, and on hardmask 247. Top electrode (TE) 191 can be formed on hardmask 247 as previously discussed with respect to FIG. 10.

Figure 12:
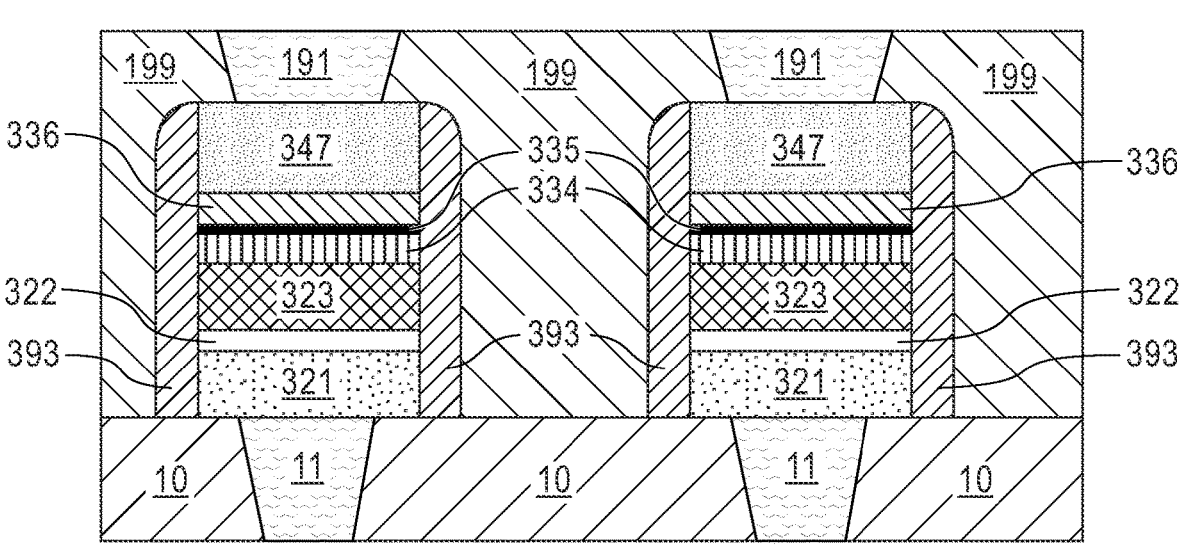
FIG. 12 is a cross-sectional view of a semiconductor structure after forming the STT-MTJ and VCMA-MTJ with a same diameter in accordance with an embodiment of the present invention.

FIG. 12 is a cross-sectional view of semiconductor structure 1200 after forming the STT-MTJ and VCMA-MTJ with a same diameter in accordance with an embodiment of the present invention. FIG. 12 illustrates an example where in semiconductor structure 500 of FIG. 5, hardmask 47 can be etched with a wider width, and then, the etch of STT free layer 36, STT tunnel barrier 35, and STT reference layer 34 depicted in FIG. 6 does not occur nor does the step of forming sidewall spacer 58 in FIG. 7. In this way, the STT-MTJ and VCMA-MTJ formed, as depicted in FIG. 12, can have a same diameter and cross-sectional area after an etch process using the wider remaining hardmask 347 as the etch mask to form both MTJs.

In one method to form semiconductor structure 1200 depicted in FIG. 12, includes depositing sequentially on BE 11 and ILD 10, VCMA reference layer 321, VCMA tunnel barrier 322, VCMA free layer 323, STT reference layer 334, STT tunnel barrier 335, STT free layer 336, and hardmask 347. Hardmask 347 can be patterned and an etch (e.g., by IBE) removes exposed portions of the STT-MTJ layers (e.g., STT free layer 336, STT tunnel barrier 335, and STT reference layer 334) and exposed portions of the VCMA-MTJ (e.g., VCMA free layer 323, VCMA tunnel barrier 322, and VCMA reference layer 321) are removed. Using known methods of spacer formation, sidewall spacer 393 can be formed around the STT-MTJ and the VCMA-MTJ. ILD 199 can be deposited and top electrode (TE) 191 formed on portions of hardmask 347.

However, in semiconductor structure 1200, in order to ensure that the deterministic switching of the VCMA-MTJ occurs, it may be necessary to tune the tunnel barrier RA of the STT-MTJ to ensure that the RA of STT tunnel barrier 335 is much smaller than the RA of VCMA tunnel barrier 322. For example, the tuning of STT tunnel barrier 335 may include using a different thickness of the tunnel barrier material in STT tunnel barrier 335.

Figure 13:
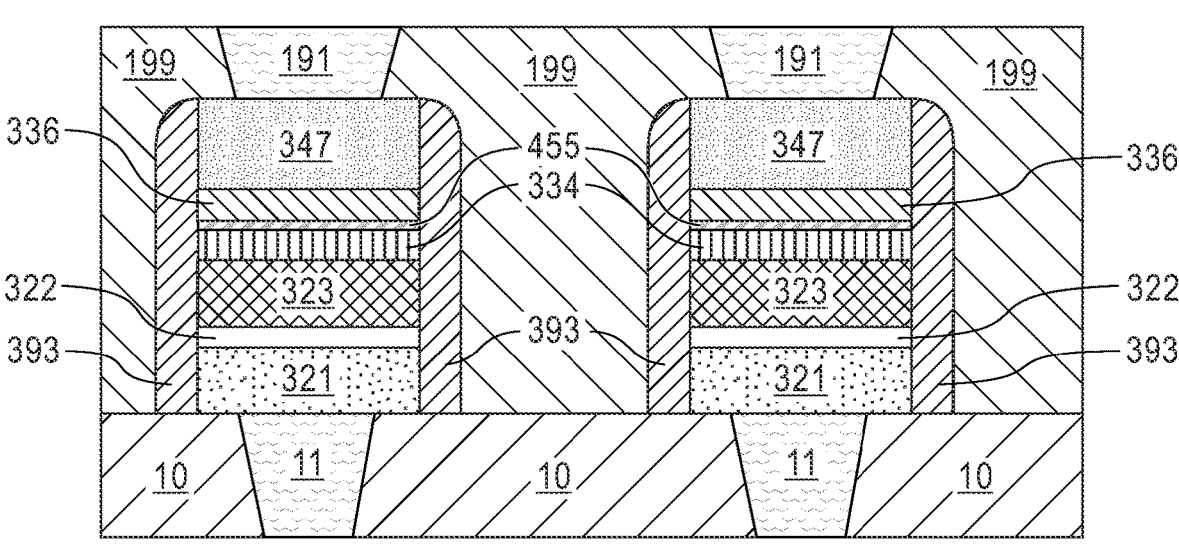
FIG. 13 is a cross-sectional view of a semiconductor structure after replacing the STT tunnel barrier layer of the STT-MTJ with a metallic spacer in accordance with an embodiment of the present invention.

FIG. 13 is a cross-sectional view of semiconductor structure 1300 after replacing STT tunnel barrier layer 335 in FIG. 12 with metallic spacer 455 in accordance with an embodiment of the present invention. As depicted, FIG. 13 includes BE 11 and ILD 10 above FEOL devices (not depicted), VCMA reference layer 321, VCMA tunnel barrier 322, VCMA free layer 323, reference layer 434, metal spacer 455, free layer 436, and hardmask 347. In this embodiment, reference layer 434, metal spacer 455, free layer 436 in semiconductor structure 1300 form a spin valve above the VCMA-MTJ composed of VCMA reference layer 321, VCMA tunnel barrier 322, VCMA free layer 323. In various embodiments, reference layer 434 is deposited with essentially the same processes and materials as STT reference layer 234. Similarly, free layer 436 can be deposited with essentially the same processes and materials as STT free layer 236.

Metal spacer 455 can be composed copper (Cu) but is not limited to these materials. The spin valve can provide better reliability than the STT-MTJ. Additionally, using metal spacer 455 in place of STT tunnel barrier 335 can reduce the resistance of the layer (e.g., as compared to MgO).

The methods, as described herein, can be used in the fabrication of integrated circuit chips or semiconductor chips. The resulting semiconductor chips can be distributed by the fabricator in raw wafer form (that is, as a single wafer that has multiple unpackaged chips), as a bare die, or in a packaged form. In the latter case, the semiconductor chip is mounted in a single chip package (such as a plastic carrier, with leads that are affixed to a motherboard or other higher-level carrier) or in a multichip package (such as a ceramic carrier that has either or both of surface interconnections or buried interconnections). In any case, the semiconductor chip is then integrated with other semiconductor chips, discrete circuit elements, and/or other signal processing devices as part of either (a) an intermediate product, such as a motherboard, or (b) an end product. The end product can be any product that includes semiconductor chips, ranging from toys and other low-end applications to advanced computer products having a display, memory, a keyboard or other input device, and a central processor.

What is claimed is:

1. A semiconductor structure comprising:
   a first magnetic tunnel junction on a bottom electrode; and
   a second magnetic tunnel junction above the first magnetic tunnel junction, wherein:
   a reference layer of the second magnetic tunnel junction contacts a free layer of the first magnetic tunnel junction; and
   the first magnetic tunnel junction has a larger cross-sectional area than the second magnetic tunnel junction.

2. The semiconductor structure of claim 1, wherein the first magnetic tunnel junction is a voltage-controlled magnetic anisotropy (VCMA) magnetic tunnel junction of a VCMA-MRAM device that is composed of a first reference layer, a first tunnel barrier layer, and a first free layer.

3. The semiconductor structure of claim 2, wherein the second magnetic tunnel junction is a spin-transfer torque (STT) magnetic tunnel junction of an STT-MRAM device that is composed of a second reference layer, a second tunnel barrier layer, and a second free layer.

4. The semiconductor structure of claim 3, wherein a stray field generated by magnetization of the second free layer of the second magnetic tunnel junction aligns a magnetization of the first free layer of the VCMA-MRAM device with the second free layer of the STT-MRAM.

5. The semiconductor structure of claim 3, wherein an etch stop layer is over the first free layer of the VCMA-MRAM device.

6. The semiconductor structure of claim 3, wherein the second magnetic tunnel junction of the STT-MRAM is surrounded by a sidewall spacer.

7. The semiconductor structure of claim 6, wherein a dielectric material encapsulates vertical sides of the sidewall spacer around the second magnetic tunnel junction of the STT-MRAM and the first magnetic tunnel junction of the VCMA-MRAM.

8. The semiconductor structure of claim 1, wherein the first magnetic tunnel junction is a spin-transfer torque (STT) magnetic tunnel junction of an STT-MRAM and the second magnetic tunnel junction is a voltage-controlled magnetic (VCMA) tunnel junction of a VCMA-MRAM.

9. The semiconductor structure of claim 8, wherein the STT magnetic tunnel junction of the STT-MRAM has a smaller cross-sectional area than the second magnetic tunnel junction of the VCMA tunnel junction of the VCMA-MRAM.

10. The semiconductor structure of claim 3, wherein a second STT magnetic tunnel junction of the STT-MRAM device is tuned to ensure that a Resistance-Area product of the second tunnel barrier layer of the STT magnetic tunnel junction is less than a Resistance-Area product of a first VCMA magnetic tunnel junction of the VCMA-MRAM.

11. The semiconductor structure of claim 1, further comprising:
a hardmask over the second magnetic tunnel junction; and
a top electrode over the hardmask.

12. The semiconductor structure of claim 1, wherein a width of a hardmask on the second magnetic tunnel junction corresponds to a width of the second magnetic tunnel junction.

13. A method comprising:
performing a write operation by applying a single voltage pulse to a stacked magnetoresistive random-access memory (MRAM) device, wherein the stacked MRAM device is composed of:
a bottom voltage-controlled magnetic anisotropy (VCMA) MRAM device; and
a top spin-transfer torque (STT) MRAM device with a smaller width than the VCMA-MRAM device.

14. The method of claim 13, wherein the single voltage pulse switches the top STT-MRAM and a stray field of the top STT-MRAM switches the bottom VCMA-MRAM to match a magnetization of the top STT-MRAM.

15. A method comprising:
performing a write operation by applying current to switch a top spin-transfer torque (STT) magnetoresistive random-access memory (MRAM) device that is over a bottom voltage-controlled magnetic anisotropy (VCMA) MRAM device to switch the top STT-MRAM device; and
applying a voltage across a top electrode and a bottom electrode.

16. The method of claim 15, wherein the voltage lowers an energy barrier of the VCMA-MRAM device.

17. The method of claim 16, wherein a stray field of the top STT-MRAM device switches the VCMA-MRAM device.

18. The method of claim 17, wherein a first free layer of the VCMA-MRAM device has a same direction as a second free layer of the STT VCMA device.

* * * * *